(12) United States Patent
Ishii et al.

(10) Patent No.: US 6,614,266 B2
(45) Date of Patent: Sep. 2, 2003

(54) SEMICONDUCTOR INTEGRATED CIRCUIT

(75) Inventors: Yuki Ishii, Kawasaki (JP); Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/006,649

(22) Filed: Dec. 10, 2001

(65) Prior Publication Data

US 2003/0011405 A1 Jan. 16, 2003

(30) Foreign Application Priority Data

Jul. 16, 2001 (JP) ........................................ 2001-215335

(51) Int. Cl.[7] .......................................... H03K 19/096
(52) U.S. Cl. ........................ 326/98; 326/95; 326/121; 326/17
(58) Field of Search ............................. 326/93, 95, 98, 326/119, 121, 112, 17

(56) References Cited

U.S. PATENT DOCUMENTS

| | | | | | |
|---|---|---|---|---|---|
| 6,060,910 A | * | 5/2000 | Inui | ............................ | 326/98 |
| 6,094,071 A | * | 7/2000 | Ciraula et al. | ................. | 326/97 |
| 6,208,170 B1 | * | 3/2001 | Iwaki et al. | ................. | 326/121 |

FOREIGN PATENT DOCUMENTS

| JP | 57-172761 | 10/1982 |
|---|---|---|
| JP | 63-140486 | 6/1988 |
| JP | 5-210976 | 8/1993 |

* cited by examiner

Primary Examiner—Michael Tokar
Assistant Examiner—Vibol Tan
(74) Attorney, Agent, or Firm—Arent Fox Kintner Plotkin & Kahn

(57) ABSTRACT

A semiconductor integrated circuit having an active mode and a standby mode includes a node at which an internal circuit is connected to a latch circuit, the latch circuit storing a data signal output from the internal circuit. A level determination unit determines a logic level of the node in response to a control signal indicating the standby mode.

10 Claims, 10 Drawing Sheets

| CONDITION | rdbz DATA | TRANSISTORS | | | | | |
|---|---|---|---|---|---|---|---|
| | | 11 | 13 | 16 | 17 | 18 | 19 |
| sbez='H' | H | OFF | ON | ON | OFF | OFF | ON |
| | L | ON | OFF | OFF | ON | ON | OFF |
| sbez='L' | H | OFF | OFF | ON | OFF | OFF | ON |
| | L | OFF | OFF | OFF | ON | ON | OFF |

FIG. 6

| CONDITION | rdbz DATA | TRANSISTORS | | | | | |
|---|---|---|---|---|---|---|---|
| | | 11 | 13 | 16A | 17A | 18A | 19A |
| ckebx='L' sbez='H' | H | OFF | ON | ON | OFF | OFF | ON |
| | L | ON | OFF | OFF | ON | ON | OFF |
| ckebx='L' sbez='L' | H | OFF | OFF | ON | OFF | OFF | ON |
| | L | OFF | OFF | OFF | ON | ON | OFF |
| ckebx='H' sbez='L' | H | OFF | ON | ON | OFF | OFF | ON |
| | L | OFF | ON | ON | OFF | OFF | ON |

FIG. 8

| CONDITION | rdbz DATA | TRANSISTORS | | | | | |
|---|---|---|---|---|---|---|---|
| | | 11 | 13 | 16A | 17A | 18A | 19A |
| ckebx='L' sbez='H' | H | OFF | ON | ON | OFF | OFF | ON |
| | L | ON | OFF | OFF | ON | ON | OFF |
| ckebx='L' sbez='L' | H | OFF | OFF | ON | OFF | OFF | ON |
| | L | OFF | OFF | OFF | ON | ON | OFF |
| ckebx='H' sbez='L' | H | OFF | OFF | ON | OFF | OFF | ON |
| | L | OFF | OFF | ON | OFF | OFF | ON |

FIG. 10

| CONDITION | rdbz DATA | TRANSISTORS | | | | | | | |
|---|---|---|---|---|---|---|---|---|---|
| | | 11 | 13 | 14 | 15 | 64 | 65 | 54 | 55 |
| ckebx='L' sbez='H' | H | OFF | ON | ON | ON | ON | OFF | OFF | ON |
| | L | ON | OFF | ON | ON | OFF | ON | ON | OFF |
| ckebx='L' sbez='L' | H | OFF | OFF | ON | ON | ON | OFF | OFF | ON |
| | L | OFF | OFF | ON | ON | OFF | ON | ON | OFF |
| ckebx='H' sbez='L' | H | OFF | OFF | ON | OFF | ON | OFF | OFF | ON |
| | L | OFF | OFF | OFF | ON | OFF | ON | ON | OFF |

SEMICONDUCTOR INTEGRATED CIRCUIT

BACKGROUND OF THE INVENTION

1. Field of the Invention

The present invention relates to a semiconductor integrated circuit in which the level of a node of the circuit during the standby mode is not uniquely determined and the sub-threshold leaking current across the node is reduced by taking the countermeasures so as to reduce the standby power consumption.

2. Description of the Related Art

It is known that complementary metal-oxide semiconductor (CMOS) circuits, such as the semiconductor integrated circuit, exhibit extremely low standby power.

For the sake of simplicity of description, suppose a simple CMOS circuit including a p-channel MOS transistor and an n-channel MOS transistor. In such CMOS circuit, when the input signal is set to the high level, the p-channel transistor is set in OFF state and the n-channel transistor is set in ON state. After the discharging of a capacitive load at the output of the CMOS circuit is performed, the n-channel transistor is set in OFF state. Normally, in this condition, the power consumption of the CMOS circuit is negligible.

When the input signal is set to the low level, the p-channel transistor is set in ON state and the n-channel transistor is set in OFF state. After the discharging of the capacitive load at the output of the CMOS circuit is performed, the p-channel transistor is set in OFF state. Normally, in this condition, the power consumption of the CMOS circuit is also negligible.

However, the level of integration of semiconductor integrated circuits is further increased from that of the conventional version with the recent developments of micro-fabrication technology used in CMOS circuits. When compared to a MOS transistor with the channel length of 1 $\mu$m, a MOS transistor with the channel length of 0.1 $\mu$m has a lower threshold voltage, and the drain current is not zero if the gate voltage (or the gate-to-source voltage) is less than the threshold voltage. Hereinafter, the drain current which leaks from the MOS transistor in the region in which the gate voltage is less than the threshold voltage is called the sub-threshold leaking current, and the region in which the gate voltage is less than the threshold voltage is called the sub-threshold region. This sub-threshold leaking current exponentially increases to the gate voltage.

Hence, the increase of the sub-threshold leaking current described above is detrimental to the demand for providing a semiconductor integrated circuit that exhibits low power consumption. Specifically, the power consumption of a semiconductor integrated circuit, including MOS transistors produced by the micro-fabrication method, during the standby mode depends on the amount of the sub-threshold leaking current. In order to reduce the power consumption, it is necessary to reduce the sub-threshold leaking current.

On the other hand, an improved semiconductor integrated circuit has been proposed, and, in this circuit, the sub-threshold leaking current is reduced by taking the countermeasures so as to reduce the standby power consumption. This semiconductor integrated circuit includes an internal circuit having MOS transistors produced by the micro-fabrication method. To prevent the lowering of the breakdown voltage of such MOS transistors, a voltage lowering circuit is provided to generate a lowered power-source voltage from an external power-source voltage. The voltage lowering circuit supplies the lowered power-source voltage to the MOS transistors of the internal circuit, thereby reducing the sub-threshold leaking current.

FIG. 1 shows a semiconductor integrated circuit in which a conventional method for reducing the sub-threshold leaking current is incorporated. Regarding the conventional method in FIG. 1, Japanese Laid-Open Patent Application No. 5-210976 discloses a similar method to reduce the sub-threshold leaking current.

As shown in FIG. 1, the semiconductor integrated circuit includes a logic circuit 100, a switching device 101, a switching device 102, and a target circuit 107. In the present example, the target circuit 107 is the circuit to which the countermeasure against the sub-threshold leaking current is to be taken.

In FIG. 1, "Viiz" and "Vssx" indicate the power-source lines which deliver the power-source voltages to reduce the sub-threshold leaking current, and "Vii" and "Vss" indicate the power-source lines which deliver the power-source voltages. When the semiconductor integrated circuit of FIG. 1 is set in the active mode, the voltage of the power-source line "Viiz" is the same as the voltage of the power-source line "Vii". When the semiconductor integrated circuit of FIG. 1 is set in the standby mode, the voltage of the power-source line "Viiz" is set in a floating state. Hereinafter, the "Viiz" and "Vssx" are called the countermeasure voltage lines, and the power-source voltage lines "Vii" and "Vss" are called the normal voltage lines, for the sake of convenience of description.

In the semiconductor integrated circuit of FIG. 1, the switching device 101 connects the countermeasure voltage line Viiz with the normal voltage line Vii. The switching device 102 connects the countermeasure voltage line Vssx with the normal voltage line Vss. The logic circuit 100 receives input signals and performs a logic operation for the input signals. A standby mode signal "stbx" indicates whether the integrated circuit is set in the standby mode, and this standby mode signal is input to the logic circuit 100. In response to the standby node signal "stbx", the logic circuit 100 respectively outputs signals "n101" and "n102" to the switching devices 101 and 102 through the logic operation. Namely, when the integrated circuit is set in the standby mode, the switching devices 101 and 102 are set in OFF state by the output signals "n101" and "n102" of the logic circuit 100. When the integrated circuit is set in the active mode, the switching devices 101 and 102 are set in ON state by the output signals "n101" and "n102" of the logic circuit 100.

In the semiconductor integrated circuit of FIG. 1, the switching devices 101 and 102 are constructed by using high-threshold transistors. The switching devices 101 and 102 serve to provide the countermeasure power-source voltages of the voltage lines "Viiz" and "Vssx" from the normal power-source voltages of the voltage lines "Vii" and "Vss". Because of the high-threshold structure of the transistors 101 and 102, the sub-threshold leaking current across each of the transistors 101 and 102 during the standby mode is virtually negligible.

In the semiconductor integrated circuit of FIG. 1, the target circuit 107 is comprised of two simple inverters that are concatenated, the first inverter including a p-channel MOS transistor 103 and an n-channel MOS transistor 104, and the second inverter including a p-channel MOS transistor 105 and an n-channel MOS transistor 106. An input signal "n103", the level of which is uniquely determined during the standby mode, is supplied to the inputs of the transistors 103 and 104 of the target circuit 107.

Suppose that the input signal "n103" is set at the low level when the integrated circuit is set in the standby mode. When the input signal "n103" is at the low level, the transistor 103 is set in ON state, and the transistor 104 is set in OFF state. In this condition, the sub-threshold leaking current may occur at the transistor 104. To avoid this, the countermeasure is taken such that the source of the transistor 103 is connected to the normal voltage line "Vii" and the source of the transistor 104 is connected to the countermeasure voltage line "Vssx". During the standby mode, the switching device 102 is set in OFF state, the source of the transistor 104 is disconnected from the normal voltage line "Vss" due to the OFF state of the switching device 102, and the sub-threshold leaking current which tends to flow through the source/drain path of the transistor 104 is avoided by the connection of the source of the transistor 104 and the countermeasure voltage line "Vssx".

Further, the input signal supplied to the second inverter of the target circuit 107 is set at the high level. The transistor 105 is set in OFF state, and the transistor 106 is set in ON state. In this condition, the sub-threshold leaking current may occur at the transistor 105. To avoid this, the countermeasure is taken such that the source of the transistor 105 is connected to the countermeasure voltage line "Viiz" and the drain of the transistor 106 is connected to the normal voltage line "Vss". During the standby mode, the switching device 101 is set in OFF state, the source of the transistor 105 is disconnected from the normal voltage line "Vii" due to the OFF state of the switching device 101, and the sub-threshold leaking current which tends to flow through the source/drain path of the transistor 105 is avoided by the connection of the source of the transistor 105 and the countermeasure voltage line "Viiz".

In the above-described circuit of FIG. 1, the two-stage concatenated inverters are provided in the target circuit 107. Alternatively, multi-stage concatenated inverters may be provided in the target circuit 107. In such alternative case, the countermeasure against the sub-threshold leaking current is taken in the same manner. Namely, the source or drain of the transistor in each of the multi-stage concatenated inverters, which transistor is set in OFF state in the standby mode, is connected to the countermeasure voltage line "Viiz" or "Vssx" in an alternate manner that is similar to the manner shown in FIG. 1.

FIG. 2 shows a sense buffer circuit in which the conventional method in FIG. 1 is incorporated. In the example of FIG. 2, the above-described conventional method to reduce the sub-threshold leaking current is applied to a sense buffer circuit of a semiconductor memory, such as a DRAM (dynamic random access memory).

In FIG. 2, "rgdbx" and "rgdbz" indicate complementary data bus signals that correspond to information of a memory cell read by a sense amplifier. A differential amplification section of the sense buffer circuit in FIG. 2 is essentially the same as a conventional differential amplifier.

In the sense buffer circuit 80 of FIG. 2, any of the normal voltage lines "Vii" and "Vss" and the countermeasure voltage lines "Viiz" and "Vssz" is connected to each of the respective elements of the sense buffer circuit 80. The incorporation of the conventional method in FIG. 1 into the sense buffer circuit 80 is achieved by the connection of the voltage lines and the circuit elements shown in FIG. 2. Similar to the circuit in FIG. 1, when the sense buffer circuit 80 of FIG. 2 is set in the active mode, the voltage of the power-source line "Viiz" is the same as the voltage of the power-source line "Vii". When the sense buffer circuit 80 of FIG. 2 is set in the standby mode, the voltage of the power-source line "Viiz" is set in a floating state.

The sense buffer circuit 80 includes a p-channel MOS transistor 81 at the node "nlO", a p-channel MOS transistor 82 at the node "n12", an inverter 91 including a p-channel MOS transistor 83 and an n-channel MOS transistor 84, an inverter 92 including a p-channel MOS transistor 85 and an n-channel MOS transistor 86, an inverter 93 including a p-channel MOS transistor 87 and an n-channel MOS transistor 88, a p-channel MOS transistor 13 at the node "n13", and an n-channel MOS transistor 11 at the node "n11". The p-channel transistor 13 and the n-channel transistor 11 form a CMOS driver that drives the output node of the sense buffer circuit 80.

In the sense buffer circuit 80 of FIG. 2, a sense buffer enable signal "sbez" is input. The sense buffer enable signal "sbez" indicates whether the sense buffer circuit 80 is requested to be set in the active mode or the standby mode. When the signal "sbez" is set at the high level ("H"), the sense buffer circuit 80 is set in the active mode. During the active mode, the differential amplification section of the sense buffer circuit 80 amplifies the complementary data buffer signals "rgdbz" and "rgdbz" corresponding to the information of the memory cell read by the sense amplifier, and outputs one of the amplified data signals to the node "n10" and the other amplified data signal to the node "n12", respectively. The sense buffer circuit 80 outputs a read-back data signal "rdbz" to a following circuit (for example, a latch circuit 90 in FIG. 3), the signal "rdbz" being set at the high level ("H") or the low level ("L") in accordance with the amplified data signals at the nodes "n11" and "n13".

On the other hand, when the sense buffer enable signal "sbez" is set at the low level ("L"), the sense buffer circuit 80 is set in the standby mode. Namely, the sense buffer circuit 80 at that time is inactive. During the standby mode of the sense buffer circuit 80, the transistor 81 at the node "nlO" and the transistor 82 at the node "n12" are set in ON state in response to the low-level state of the input signal "sbez". Both the level of the node "n10" and the level of the node "n12" are set at the high level. The level of the node "n11" is equal to the potential of the normal voltage line "Vss", and the level of the node "n13" is equal to the potential of the normal voltage line "Vii". Both the transistor 11 and the transistor 13 are set in OFF state. In this condition, the p-channel MOS transistor 83, the p-channel MOS transistor 87 and the n-channel MOS transistor 86 are set in OFF state. During the standby mode, the sub-threshold leaking current may occur at the transistors 83, 86 and 87 in the sense buffer circuit 80. To avoid this, the countermeasure is taken such that one end of each of the inverters 91, 92 and 93 is connected to the countermeasure voltage line "Viiz" or "Vssx". Hence, the conventional method in FIG. 1 is incorporated into the sense buffer circuit 80.

However, the output node of the sense buffer circuit 80, where the signal "rdbz" is output to a following circuit, is connected to a latch circuit 90 (which is shown in FIG. 3), for the purposes of prevention of pass-through current and accuracy of output timing. Because of the latch circuit 90, the level of the output node of the sense buffer circuit 80 during the standby mode is not uniquely determined, which will be described in detail in the following.

FIG. 3 shows a latch circuit to which the sense buffer circuit in FIG. 2 is connected. For the sake of simplicity of description, suppose that the latch circuit 90 in FIG. 3 is a single-stage latch circuit, and this latch circuit 90 receives the signal "rdbz" from the output node of the sense buffer circuit 80 in FIG. 2.

As shown in FIG. 3, the latch circuit 90 is constructed by two inverters that are concatenated: one of the inverters is formed by a pair of p-channel and n-channel MOS transistors 16 and 17, and the other inverter is formed by a pair of p-channel and n-channel MOS transistors 18 and 19. The latch circuit 90 serves to store a previous state of the output node of the sense buffer circuit 80 before it is set in the inactive condition (or before it is set in the standby mode).

FIG. 4 is a diagram for explaining operation of the sense buffer circuit 80 of FIG. 2 wherein the logic levels of the output node of the sense buffer circuit 80 are connected to the latch circuit 90 of FIG. 3.

As shown in FIG. 4, when the sense buffer enable signal "sbez" is at the high level "H", the sense buffer circuit 80 is set in the active mode. In this condition, the signal "rdbz", which is output by the sense buffer circuit 80, is set at the high level ("H") or the low level ("L") in accordance with the complementary data buffer signals "rgdbz" and "rgdbz". When the signal "rdbz" is at the high level, the transistor 11 and the transistor 13, which are provided at the output node of the sense buffer circuit 80, are set in OFF state and in ON state, respectively. The transistor 16 and the transistor 17 in the latch circuit 90 at that time are set in ON state and OFF state, and the transistor 18 and the transistor 19 are set in OFF state and ON state, respectively. Namely, the state of the output node of the sense buffer circuit 80 (the transistor 11 OFF and the transistor 13 ON) at that time is retained by the latch circuit 90.

Moreover, as shown in FIG. 4, when the signal "rdbz" is at the low level during the active mode of the sense buffer circuit 80, the transistor 11 and the transistor 13 at the output node of the sense buffer circuit 80 are set in ON state and in OFF state, respectively. The transistor 16 and the transistor 17 in the latch circuit 90 at that time are set in OFF state and ON state, and the transistor 18 and the transistor 19 are set in ON state and OFF state, respectively. Namely, the state of the output node of the sense buffer circuit 80 (the transistor 11 ON and the transistor 13 OFF) at that time is retained by the latch circuit 90.

As described above, the transistors of the latch circuit 90 store the state of the output node of the sense buffer circuit 80 at the time the sense buffer circuit 80 is set in the active mode.

However, when the sense buffer enable signal "sbez" is at the low level "L", the sense buffer circuit 80 is set in the standby mode. That is, the sense buffer circuit 80 is inactive. The level of the node "n11" of the sense buffer circuit 80 is equal to the potential of the normal voltage line "Vss", and the level of the node "n13" is equal to the potential of the normal voltage line "Vii". Both the transistor 11 and the transistor 13 at the output node are set in OFF state. In this condition, the transistors of the latch circuit 90 store the previous state of the output node of the sense buffer circuit 80 prior to the time the sense buffer circuit 80 is set in the inactive (or standby) mode. For this reason, the level of the output node of the sense buffer circuit 80 during the standby mode is not uniquely determined, and it is difficult to reduce the sub-threshold leaking current by applying the conventional method in FIG. 1 to the sense buffer circuit 80.

More specifically, if the signal "rdbz" from the output node of the sense buffer circuit 80 is at the high level, the sub-threshold leaking current from the n-channel MOS transistor 11 may flow through the latch circuit 90. If the signal "rdbz" is at the low level, the sub-threshold leaking current from the p-channel MOS transistor 13 may flow through the latch circuit 90.

Further, if the signal "rdbz" is at the high level, the sub-threshold leaking current may flow into the transistors 18 and 17 of the latch circuit 90. If the signal "rdbz" is at the low level, the sub-threshold leaking current may flow into the transistors 19 and 16 of the latch circuit 90. In order to effectively apply the conventional method in FIG. 1 to the sense buffer circuit 80, it is necessary that the level of the output node (the signal "rdbz") of the sense buffer circuit 80 during the standby mode be uniquely determined. However, if the level of the output node during the standby mode is not uniquely determined, the conventional method in FIG. 1 is not easily applied to the sense buffer circuit 80 so as to reduce the sub-threshold leaking current, and it is difficult for the sense buffer circuit 80 to provide low standby power consumption.

SUMMARY OF THE INVENTION

An object of the present invention is to provide an improved semiconductor integrated circuit in which the above-described problems are eliminated.

Another object of the present invention is to provide a semiconductor integrated circuit which is configured to enable the reduction of the sub-threshold leaking current across a node of the circuit even when the level of the node during the standby mode is not uniquely determined.

The above-mentioned objects of the present invention are achieved by a semiconductor integrated circuit having an active mode and a standby mode, comprising: a node at which an internal circuit is connected to a latch circuit, the latch circuit storing a data signal output from the internal circuit; and a level determination unit which determines a logic level of the node in response to a control signal indicating the standby mode.

The above-mentioned objects of the present invention are achieved by a semiconductor integrated circuit having an active mode and a standby mode, comprising: a node which is set at a logic level that is not uniquely determined in the standby mode; a pair of first transistors each of which has an output connected to the node, the first transistors driving the node to output a signal; a logic circuit which receives the signal from the node as an input signal and outputs a control signal based on the logic level of the node in the standby mode; and a pair of second transistors each of which is connected in series to one of the first transistors and being set in one of ON state and OFF state based on the control signal output by the logic circuit in the standby mode.

The above-mentioned objects of the present invention are achieved by a semiconductor integrated circuit having an active mode and a standby mode, comprising: a node which is set at a logic level that is not uniquely determined in the standby mode; and a CMOS driver which includes a p-channel transistor and an n-channel transistor each having an output connected to the node, the CMOS driver driving the node so as to output a data signal in the active mode, and the p-channel transistor and the n-channel transistor of the CMOS driver being set in OFF state in the standby mode, wherein the p-channel transistor and the n-channel transistor of the CMOS driver are connected to power-source voltage lines having a floating state in the standby mode.

According to the semiconductor integrated circuit of the present invention, it is possible to easily take the countermeasures against the sub-threshold leaking current by determining uniquely the level of the node of the circuit during the standby mode. In the semiconductor integrated circuit of the present invention the sub-threshold leaking current across the node of the circuit during the standby mode can be effectively reduced, and the semiconductor integrated circuit of the present invention is effective in reducing the standby power consumption.

BRIEF DESCRIPTION OF THE DRAWING

Other objects, features and advantages of the present invention will become apparent from the following detailed description when read in conjunction with the accompanying drawings.

FIG. 6 is a diagram for explaining operation of the sense buffer circuit in FIG. 5.

FIG. 8 is a diagram for explaining operation of the sense buffer circuit in FIG. 7.

FIG. 10 is a diagram for explaining operation of the sense buffer circuit in FIG. 9.

DETAILED DESCRIPTION OF PREFERRED EMBODIMENTS

A description will now be provided of the preferred embodiments of the present invention with reference to the accompanying drawings.

Figure 5:
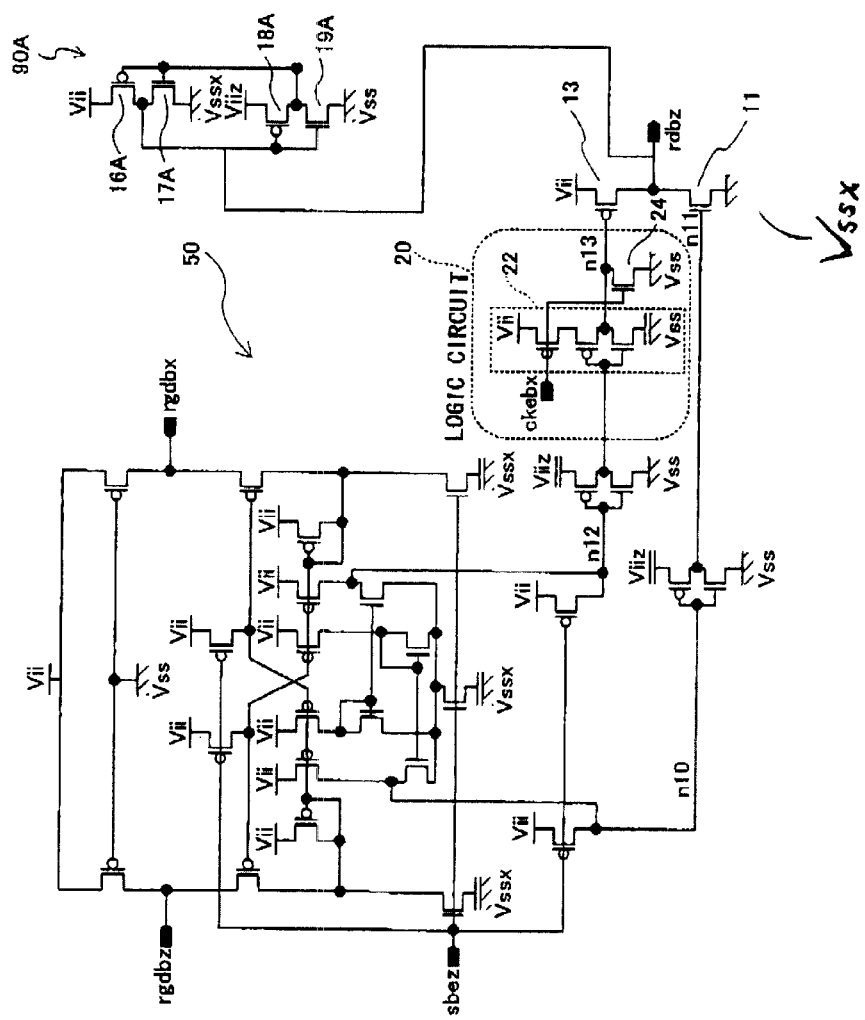
FIG. 5 is a circuit diagram of a sense buffer circuit in which one preferred embodiment of the semiconductor integrated circuit of the invention is provided.

FIG. 5 shows a sense buffer circuit in which one preferred embodiment of the semiconductor integrated circuit of the invention is provided. In FIG. 5, the elements that are essentially the same as corresponding elements in FIG. 2 are designated by the same reference characters or numerals, and a description thereof will be omitted.

In the sense buffer circuit 50 in FIG. 5, a logic circuit 20 is inserted at the location preceding the p-channel MOS transistor 13 at the output node of the sense buffer circuit. Other elements of the sense buffer circuit 50 in FIG. 5 are essentially the same as corresponding elements of the conventional sense buffer circuit 80 in FIG. 2. Similar to the sense buffer circuit 80 in FIG. 2, when the sense buffer circuit 50 of FIG. 5 is set in the active mode, the voltage of the power-source line "Viiz" is the same as the voltage of the power-source line "Vii". When the sense buffer circuit 50 of FIG. 5 is set in the standby mode, the voltage of the power-source line "Viiz" is set in a floating state.

Figure 2:
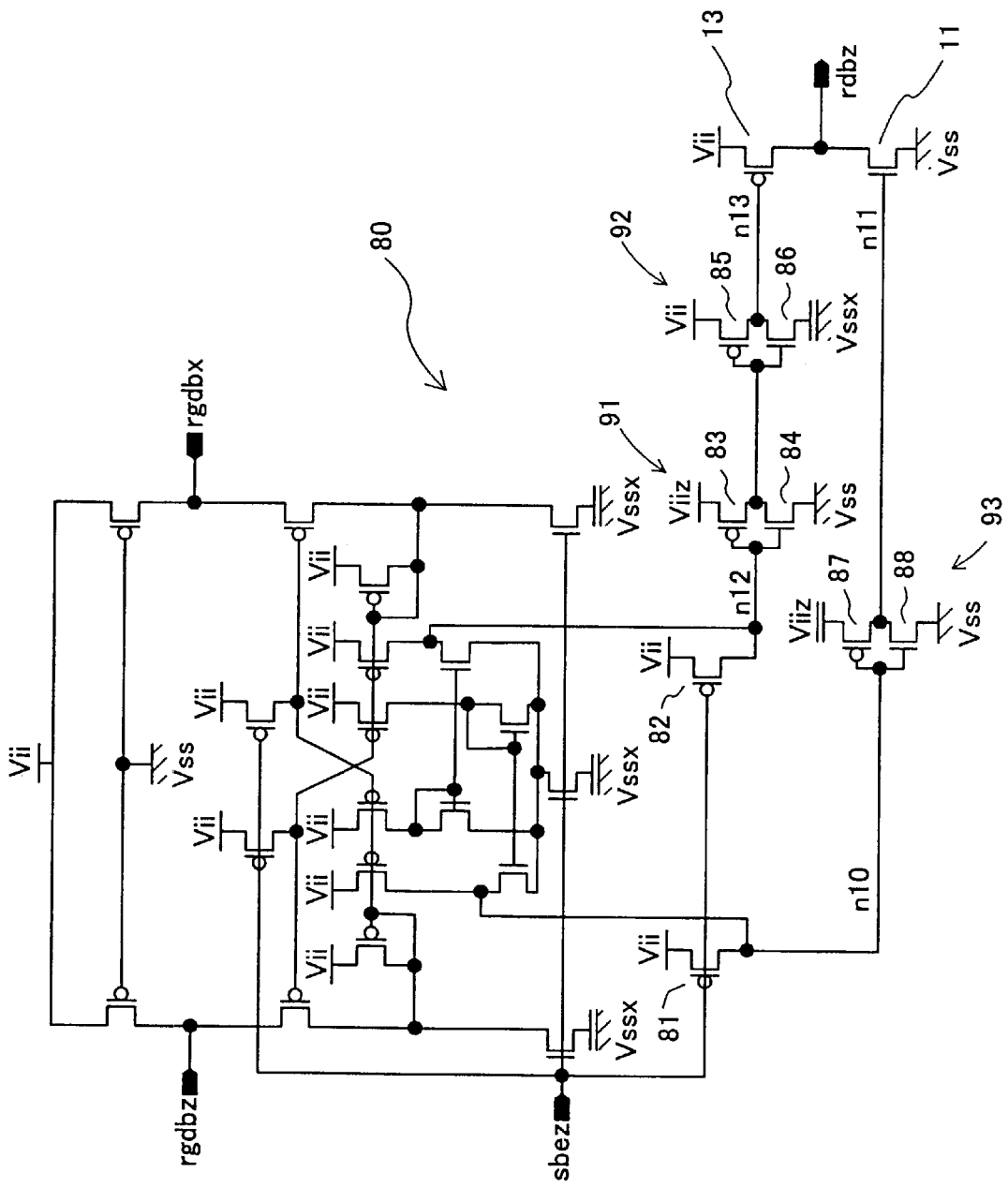
FIG. 2 is a circuit diagram of a sense buffer circuit in which the conventional method is incorporated.
Figures 3, 4:
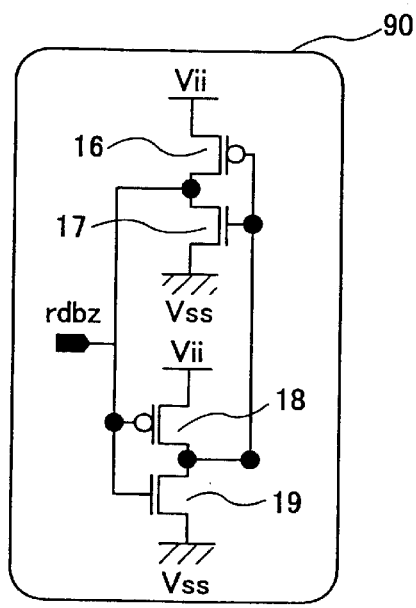
FIG. 3 is a circuit diagram of a latch circuit to which the sense buffer circuit in FIG. 2 is connected.
FIG. 4 is a diagram for explaining operation of the sense buffer circuit in FIG. 2.

The differential amplification section of the sense buffer circuit 50 in FIG. 5 is essentially the same as that of the conventional sense buffer circuit 80 in FIG. 2. In the sense buffer circuit 50 of the present embodiment, the output node of the sense buffer circuit 50, where the transistors 11 and 13 are provided, is connected to a latch circuit 90A, and the latch circuit 90A receives the signal "rdbz" output from the output node of the sense buffer circuit 50. Similar to the latch circuit 90 in the conventional sense buffer circuit 80, the latch circuit 90A in the present embodiment is constructed by two concatenated inverters: one of the inverters is formed by a pair of transistors 16A and 17A; and the other inverter is formed by a pair of transistors 18A and 19A.

As shown in FIG. 5, a control signal "ckebx" is generated by a control unit (not shown), and the signal "ckebx" from the control unit is input to the logic circuit 20. In the present embodiment, the signal "ckebx" is set at the low level ("L") when the sense buffer circuit 50 is set in the active mode ("sbez"="H"). The signal "ckebx" is set at the high level ("H") when the sense buffer circuit 50 is set in the standby mode ("sbez"="L"). There is no case in which the signal "ckebx" is at the high level and the signal "sbez" is at the high level.

The logic circuit 20 of the present embodiment generally includes an NOR circuit 22 which receives the signal "ckebx" at a first input thereof, and an n-channel MOS transistor 24 which is connected to the NOR circuit 22. The NOR circuit 22 receives the data signal at a second input thereof, the data signal being delivered from the inverter 91 to the second input of the NOR circuit 22. The source of the transistor 24 is connected to the node "n13", which is connected to the inverting input of the gate of the transistor 13. Similar to the conventional sense buffer circuit 80, the transistor 11 and the transistor 13 in the present embodiment are located at the output node (the signal "rdbz") of the sense buffer circuit 50.

FIG. 6 is a diagram for explaining operation of the sense buffer circuit 50 including the latch circuit 90A connected to the output node of the sense buffer circuit 50 where the signal "rdbz" is output.

As shown in FIG. 6, when the sense buffer circuit 50 is set in the active mode ("sbez"="H"), the signal "ckebx" is always set at the low level ("L"). The p-channel MOS transistor 26 of the logic circuit 22, which receives the signal "ckebx" at the inverting input thereof, is set in ON state. The n-channel MOS transistor 24, which is connected to the NOR circuit 22, is set in OFF state. Namely, during the active mode of the sense buffer circuit 50, the logic circuit 20 operates in the manner similar to the typical inverter.

When the sense buffer circuit 50 is set in the standby mode ("sbez"="L"), the signal "ckebx" is set at the high level ("H"). Suppose that, in this condition, the signal "ckebx" is set at the high level ("H"). The p-channel MOS transistor 26 of the logic circuit 22, receiving the signal "ckebx" at the inverting input thereof, is set in OFF state. The n-channel MOS transistor 24, which is connected to the NOR circuit 22, is set in ON state. Namely, in the standby mode, the logic circuit 20 uniquely determines the level of the node "n13" of the sense buffer circuit 50 as being at the low level ("L"). The transistor 24 forms a clamping transistor that is connected to the output node of the sense buffer circuit 50 and set in ON state based on the signal "ckebx" in the standby mode. Hence, during the standby mode, the p-channel MOS transistor 13 is set in ON state and the n-channel MOS transistor 11 is set in OFF state. In this condition, the signal "rdbz" from the output node of the sense buffer circuit 50 is set at the high level ("H"). The latch circuit 90A maintains the level of the output node (the signal "rdbz") of the sense buffer circuit 50 to be at the high level ("H"). In other words, the logic circuit 20 is provided to uniquely determine the level of the output node of the sense buffer circuit 50 during the standby mode as being the high level.

Therefore, in the present embodiment, the countermeasures against the sub-threshold leaking current during the standby mode are taken as follows: the drain of the n-channel MOS transistor 11 of the sense buffer circuit 50 is connected to the countermeasure voltage line "Vssx"; the source of the p-channel MOS transistor 18A of the latch circuit 90A is connected to the countermeasure voltage line "Viiz"; and the drain of the n-channel MOS transistor 17A of the latch circuit 90A is connected to the countermeasure voltage line "Vssx".

According to the above-described embodiment, the logic circuit 20 forms a level determination unit that uniquely determines the level of the output node of the sense buffer circuit 50 during the standby mode based on the level of the signal "ckebx", even if the output node of the sense buffer circuit 50 is connected to the latch circuit 90A. Specifically, when the signal "ckebx" is set at the high level in the standby mode of the sense buffer circuit 50, the logic circuit 20 uniquely determines the level of the output node (the signal "rdbz") of the sense buffer circuit 50 as being at the high level. By using the level determination unit (the logic circuit 20), the sense buffer circuit 50 of the present embodiment makes it possible to easily take the countermeasures against the sub-threshold leaking current across the output node of the sense buffer circuit 50. Therefore, the sense buffer circuit 50 of the present embodiment can remarkably reduce the sub-threshold leaking current during the standby mode by the use of the countermeasure voltage line "Viiz" or "Vssx", thereby reducing the standby power consumption.

Figure 1:
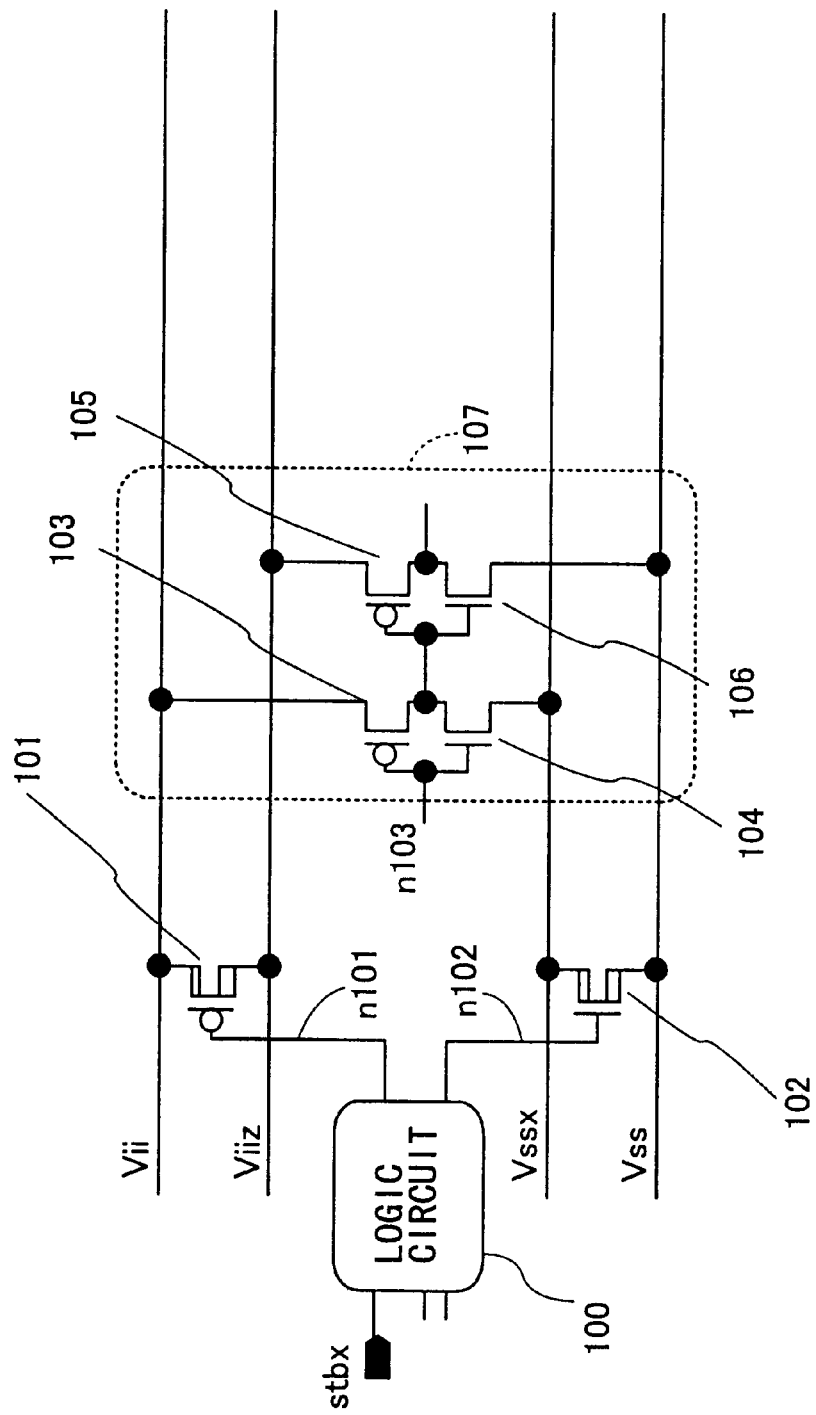
FIG. 1 is a circuit diagram of a semiconductor integrated circuit in which a conventional method for reducing the sub-threshold leaking current is incorporated.

In the above-described embodiment, the high-threshold transistor 101 and the high-threshold transistor 102, which are the same as the corresponding elements of the semiconductor integrated circuit of FIG. 1, may be connected between the normal voltage line "Vii" and the countermeasure voltage line "Viiz" and between the normal voltage line "Vss" and the countermeasure voltage line "Vssx", respectively, in order to provide the countermeasure power-source voltages of the voltage lines "Viiz" and "Vssx" from the normal power-source voltages of the voltage lines "Vii" and "Vss". However, the present invention is not limited to such high-threshold transistors. For example, for the same purpose as mentioned above, a transistor that has a normal-level threshold voltage but has a small size (or operable at a small driving current) may be used instead for each of these transistors 101 and 102.

As a variation of the above embodiment of FIG. 5, a second logic circuit (not shown) may be used instead of the logic circuit 20. This second logic circuit is inserted at the location preceding the n-channel MOS transistor 11 at the output node of the sense buffer circuit 50. The control signal "ckebx", which is the same as the above embodiment of FIG. 5, is input to the second logic circuit.

In the case of the sense buffer circuit 50 in which the second logic circuit is provided, when the signal "ckebx" is set at the high level ("H") in the standby mode of the sense buffer circuit 50, the second logic circuit uniquely determines the level of the node "n11" of the sense buffer circuit 50. During the standby mode of the sense buffer circuit 50, the p-channel MOS transistor 13 is set in OFF state and the n-channel MOS transistor 11 is set in ON state. In this condition, the signal "rdbz" from the output node of the sense buffer circuit 50 is set at the high level ("H"). The latch circuit 90A maintains the level of the output node (the signal "rdbz") of the sense buffer circuit 50 to be at the low level ("L"). Therefore, in the above alternative embodiment, the countermeasures against the sub-threshold leaking current during the standby mode are taken as follows: the source of the p-channel MOS transistor 13 is connected to the countermeasure voltage line "Viiz"; the drain of the n-channel MOS transistor 19A is connected to the countermeasure voltage line "Vssx"; and the source of the p-channel MOS transistor 16A is connected to the countermeasure voltage line "Viiz".

According to the above alternative embodiment, the second logic circuit forms a level determination unit that uniquely determines the level of the output node of the sense buffer circuit 50 during the standby mode based on the level of the signal "ckebx", even if the output node of the sense buffer circuit 50 is connected to the latch circuit 90A. Specifically, when the signal "ckebx" is set at the high level in the standby mode of the sense buffer circuit 50, the second logic circuit forms a level determination unit that uniquely determines the level of the output node (the signal "rdbz") of the sense buffer circuit 50 as being at the high level. By using the level determination unit (the second logic circuit), the sense buffer circuit 50 of such alternative embodiment makes it possible to easily take the countermeasures against the sub-threshold leaking current across the output node of the sense buffer circuit 50. Therefore, the sense buffer circuit 50 of this embodiment can remarkably reduce the sub-threshold leaking current during the standby mode by the use of the countermeasure voltage line "Viiz" or "Vssx", thereby reducing the standby power consumption.

Figure 7:
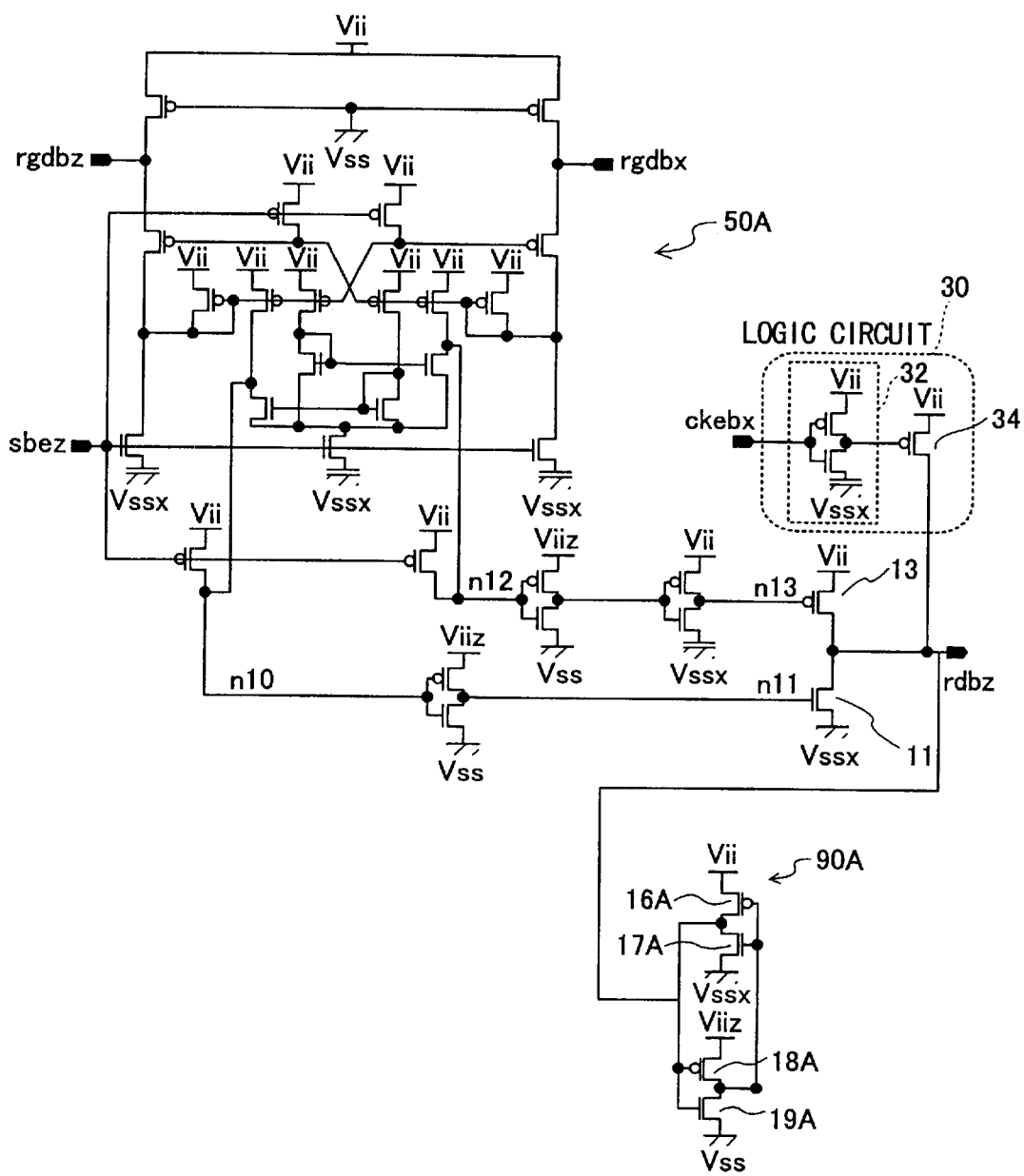
FIG. 7 is a circuit diagram of a sense buffer circuit in which another preferred embodiment of the semiconductor integrated circuit of the invention is provided.

Next, FIG. 7 shows a sense buffer circuit in which another embodiment of the semiconductor integrated circuit of the invention is provided. In FIG. 7, the elements that are essentially the same as corresponding elements in FIG. 2 are designated by the same reference characters or numerals, and a description thereof will be omitted.

In the sense buffer circuit 50A of FIG. 7, a logic circuit 30 is inserted, instead of the logic circuit 20, at the location preceding the output node of the sense buffer circuit 50A where the signal "rdbz" is output. Other elements of the sense buffer circuit 50A in FIG. 7 are essentially the same as corresponding elements of the previous embodiment in FIG. 5.

The differential amplification section of the sense buffer circuit 50A in FIG. 7 is essentially the same as that of the conventional sense buffer circuit 80 in FIG. 2. In the sense buffer circuit 50A of the present embodiment, the output node of the sense buffer circuit 50A, where the transistors 11 and 13 are provided, is connected to the latch circuit 90A that is essentially the same as that of the previous embodiment in FIG. 5. The latch circuit 90A receives the signal "rdbz" from the output node of the sense buffer circuit 50A.

FIG. 8 is a diagram for explaining operation of the sense buffer circuit 50A which includes the latch circuit 90A connected to the output node of the sense buffer circuit 50A where the signal "rdbz" is output.

As shown in FIG. 7, the control signal "ckebx" is generated by a control unit (not shown), and the signal "ckebx" is input to the logic circuit 30. In the present embodiment, the signal "ckebx" is set at the low level ("L") when the sense buffer circuit 50A is set in the active mode ("sbez"="H"). The signal "ckebx" is set at the high level ("H") when the sense buffer circuit 50 is set in the standby mode ("sbez"= "L"). There is no case in which the signal "ckebx" is at the high level and the signal "sbez" is at the high level.

The logic circuit 30 of the present embodiment generally includes an inverter circuit 32 which receives the signal "ckebx" at an input thereof, and a p-channel MOS transistor 34 which is connected to the inverter circuit 32. The source of the transistor 34 is connected to the normal voltage line "Vii", and the drain of the transistor 34 is connected to the output node of the sense buffer circuit 50A. Similar to the conventional sense buffer circuit 80, the transistor 11 and the transistor 13 in the present embodiment are located at the output node (the signal "rdbz") of the sense buffer circuit 50A.

As shown in FIG. 8, when the sense buffer circuit 50A is set in the standby mode ("sbez"="L"), the signal "ckebx" is set at the high level ("H"). In this condition, both the transistor 11 and the transistor 13 are set in OFF state. The respective transistors of the latch circuit 90A serve to store the previous state of the output node of the sense buffer circuit 50A before the sense buffer circuit 50A is set in the standby mode. Hence, the output node of the sense buffer circuit 50A is set at the level that depends on the previous state of the data signal "rdbz" at the output node of the circuit 50A before it is set in the standby mode.

Suppose that, in this condition, the signal "ckebx" is set at the high level ("H"). The inverter 32 of the logic circuit 30, which receives the signal "ckebx" at the input thereof, outputs the low level ("L"). The p-channel MOS transistor 34, the gate of which is connected to the output of the inverter 32, is set in ON state. Namely, in the standby mode, the logic circuit 30 uniquely determines the level of the output node of the sense buffer circuit 50A as being at the high level ("H"). Hence, during the standby mode of the sense buffer circuit 50A, the signal "rdbz" from the output node of the sense buffer circuit 50A is set at the high level ("H") even when the output node of the circuit 50A is connected to the latch circuit 90A.

Therefore, in the present embodiment, the countermeasures against the sub-threshold leaking current during the standby mode are taken as follows: the drain of the n-channel MOS transistor 11 of the sense buffer circuit 50A is connected to the countermeasure voltage line "Vssx"; the source of the p-channel MOS transistor 18A of the latch circuit 90A is connected to the countermeasure voltage line "Viiz"; the drain of the n-channel MOS transistor 17A of the latch circuit 90A is connected to the countermeasure voltage line "Vssx"; and the drain of the n-channel MOS transistor of the inverter 32 of the logic circuit 30 is connected to the countermeasure voltage line "Vssx".

According to the above-described embodiment, the logic circuit 30 forms a level determination unit that uniquely determines the level of the output node of the sense buffer circuit 50A during the standby mode based on the level of the signal "ckebx", even if the output node of the sense buffer circuit 50A is connected to the latch circuit 90A. Specifically, when the signal "ckebx" is set at the high level in the standby mode of the sense buffer circuit 50A, the logic circuit 30 uniquely determines the level of the output node of the sense buffer circuit 50 as being at the high level. By using the level determination unit (the logic circuit 30), the sense buffer circuit 50A of the present embodiment makes it possible to easily take the countermeasures against the sub-threshold leaking current across the output node of the sense buffer circuit 50A. Therefore, the sense buffer circuit 50A of the present embodiment can remarkably reduce the sub-threshold leaking current during the standby mode by the use of the countermeasure voltage line "Viiz" or "Vssx", thereby reducing the standby power consumption.

As a variation of the embodiment of FIG. 7, a second logic circuit (not shown) may be used instead of the logic circuit 30. The second logic circuit is inserted at the location preceding the output node of the sense buffer circuit 50A where the signal "rdbz" is output. The control signal "ckebx", which is the same as the above embodiment of FIG. 7, is input to the second logic circuit.

In the case of the sense buffer circuit 50A in which the second logic circuit is provided, when the signal "ckebx" is set at the high level ("H") in the standby mode of the sense buffer circuit 50A, the second logic circuit forms a level determination unit that uniquely determines the level of the output node (the signal "rdbz") of the sense buffer circuit 50A as being at the low level even when the output node of the circuit 50A is connected to the latch circuit 90A. Therefore, in the above alternative embodiment, the countermeasures against the sub-threshold leaking current during the standby mode are taken as follows: the source of the p-channel MOS transistor 13 of the sense buffer circuit 50A is connected to the countermeasure voltage line "Viiz"; the drain of the n-channel MOS transistor 19A of the latch circuit 90A is connected to the countermeasure voltage line "Vssx"; the source of the p-channel MOS transistor 16A of the latch circuit 90A is connected to the countermeasure voltage line "Viiz"; and the source of the p-channel MOS transistor of the inverter of the second logic circuit is connected to the countermeasure voltage line "Viiz".

According to the above alternative embodiment, the second logic circuit forms a level determination unit that uniquely determines the level of the output node of the sense buffer circuit 50A during the standby mode based on the level of the signal "ckebx", even if the output node of the sense buffer circuit 50A is connected to the latch circuit 90A. Specifically, when the signal "ckebx" is set at the high level in the standby mode of the sense buffer circuit 50, the second logic circuit uniquely determines the level of the output node (the signal "rdbz") of the sense buffer circuit 50 as being at the low level. By using the level determination unit (the second logic circuit), the sense buffer circuit 50A of such alternative embodiment makes it possible to easily take the countermeasures against the sub-threshold leaking current across the output node of the sense buffer circuit 50A. Therefore, the sense buffer circuit 50A of this embodiment can remarkably reduce the sub-threshold leaking current during the standby mode by the use of the countermeasure voltage line "Viiz" or "Vssx", thereby reducing the standby power consumption.

Figure 9:
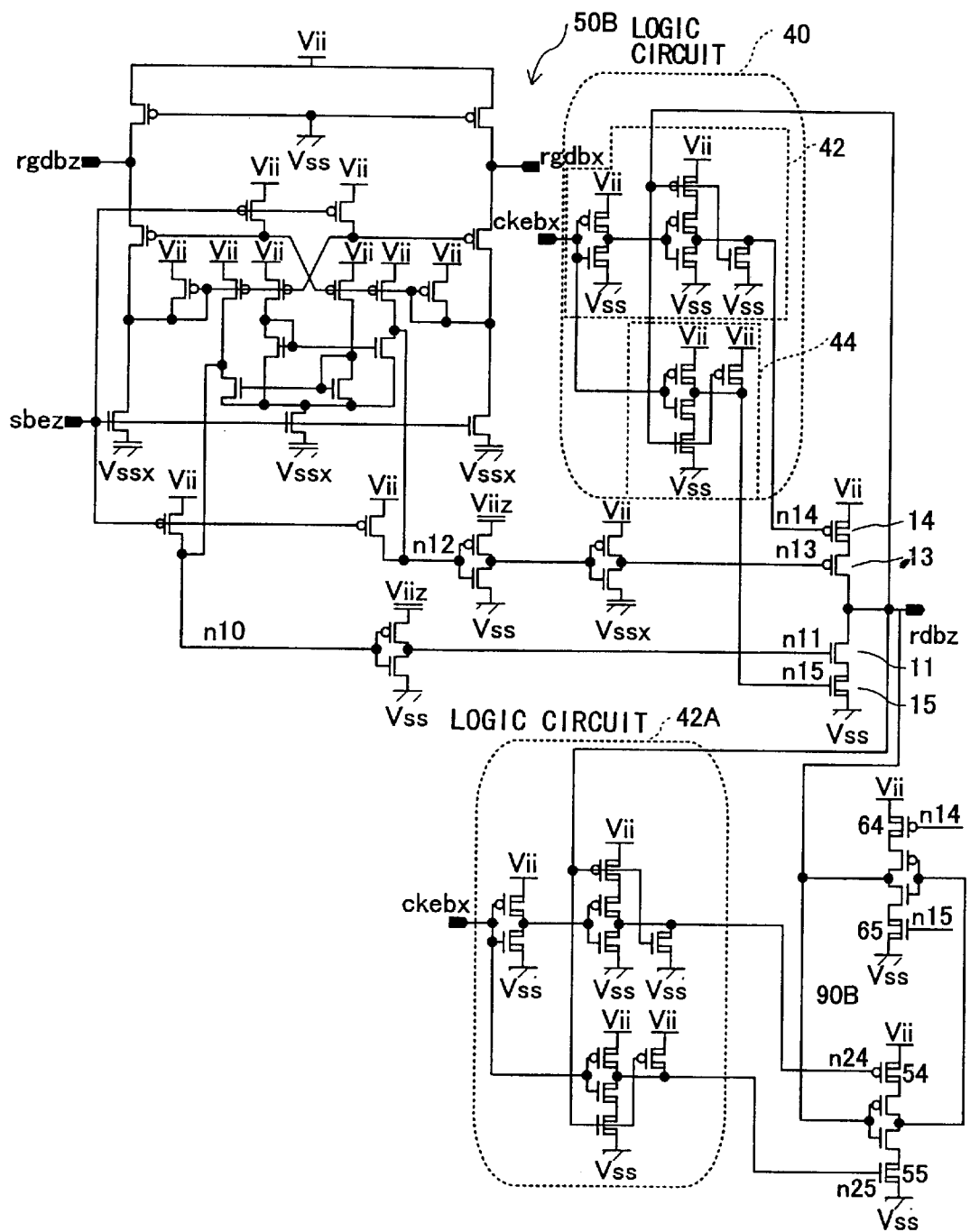
FIG. 9 is a circuit diagram of a sense buffer circuit in which another preferred embodiment of the semiconductor integrated circuit of the invention is provided.

Next, FIG. 9 shows a sense buffer circuit in which another embodiment of the semiconductor integrated circuit of the invention is provided. In FIG. 9, the elements that are essentially the same as corresponding elements in FIG. 2 are designated by the same reference characters or numerals, and a description thereof will be omitted.

FIG. 10 is a diagram for explaining operation of the sense buffer circuit 50B which includes a latch circuit 90B connected to the output node of the sense buffer circuit 50B where the signal "rdbz" is output.

As described earlier, the previous embodiment of FIG. 5 (or FIG. 7) employs the logic circuit 20 (or 30) that forcefully changes the level of the output node of the sense buffer circuit during the standby mode based on the level of the signal "ckebx", thereby making it possible to easily take the countermeasures against the sub-threshold leaking current across the output node of the sense buffer circuit. Apart from the previous embodiments of FIG. 5 and FIG. 7, the sense buffer circuit 50B of the present embodiment uses logic circuits 40 and 42A each receiving both the signal "ckebx" from the control unit (not shown) and the signal "rdbz" from the output node of the sense buffer circuit 50B. These logic circuits make it possible to easily take the countermeasures against the sub-threshold leaking current across the output node of the sense buffer circuit 50B, irrespective of the level of the output node of the sense buffer circuit 50B that is not uniquely determined during the standby mode. According to the present embodiment, the previous state of the data signal "rdbz" output from the output node of the sense buffer circuit 50B can be stored without making a forceful change thereto even after the sense buffer circuit 50B is set in the standby mode.

In the sense buffer circuit 50B of FIG. 9, a p-channel high-threshold transistor 14 and an n-channel high-threshold transistor 15 are connected between the transistor 13 and the normal voltage line "Vii" and between the transistor 11 and the normal voltage line "Vss", respectively. Because of the high-threshold structure of the transistors 14 and 15, the sub-threshold leaking current across each of the transistors 14 and 15 during the standby mode is virtually negligible.

Similarly, in the latch circuit 90B, a p-channel high-threshold transistor 64 and an n-channel high-threshold transistor 65 are connected between the p-channel MOS transistor of one of the two inverters and the normal voltage line "Vii" and between the n-channel MOS transistor of the same inverter and the normal voltage line "Vss", respectively. Moreover, in the latch circuit 90B, a p-channel high-threshold transistor 54 and an n-channel highthreshold transistor 55 are connected between the p-channel MOS transistor of the other inverter and the normal voltage line "Vii" and between the n-channel MOS transistor of the same inverter and the normal voltage line "Vss", respectively. The sub-threshold leaking current across each of the transistors 54, 55, 64 and 65 during the standby mode is virtually negligible.

In the sense buffer circuit 50B of FIG. 9, the logic circuit 40 receives both the signal "ckebx" and the signal "rdbz" from the output node of the sense buffer circuit 50B, and controls the ON/OFF states of the respective transistors 14, 64, 15 and 65 by outputting the control signals to the nodes "n14" and "n15" to which the gates of the transistors 14, 64, 15 and 65 are connected. Moreover, the logic circuit 42A receives both the signal "ckebx" and the signal "rdbz" as the input signals, and controls the ON/OFF states of the respective transistors 54 and 55 by outputting the control signals to the nodes "n24" and "n25" to which the gates of the transistors 54 and 55 are connected.

As shown in FIG. 9, in the sense buffer circuit 50B, the logic circuit 40 includes an NOR circuit 42 which receives the signal "ckebx" and the signal "rdbz" as the input signals, and an NAND circuit 44 which receives the signal "ckebx" and the signal "rdbz" as the input signals. All of the transistors included in the logic circuit 40 are constructed by the high-threshold transistors that are the same as the high-threshold transistors 14, 15, 64, 65, 54 and 55 described above. The NOR circuit 42 outputs the control signal to the gate of each of the transistors 14 and 64 (which are located at the node "n14" of the sense buffer circuit 50B) based on the input signals. The NAND circuit 44 outputs the control signal to the gate of each of the transistors 15 and 65 (which are located at the node "n15" of the sense buffer circuit 50B) based on the input signals.

In addition, the logic circuit 42A has the construction that is the same as that of the logic circuit 40 described above. The NOR circuit of the logic circuit 42A outputs the control signal to the gate of the transistor 54 (which is located at the node "n24" of the sense buffer circuit 50B) based on the input signals. The NAND circuit of the logic circuit 42A outputs the control signal to the gate of the transistor 55 (which is located at the node "n25" of the sense buffer circuit 50B) based on the input signals.

As shown in FIG. 10, when the signal "sbez" is set at the high level ("sbez"="H"), the sense buffer circuit 50B is set in the active mode, the NOR circuit 42 of the logic circuit 40 sets the node "n14" at the low level ("L"), and the NAND circuit 44 of the logic circuit 40 sets the node "n15" at the high level ("H"), irrespective of whether the data signal "rdbz" is set at the high level or the low level. Namely, the transistor 14 is set in ON state and the transistor 15 is set in ON state. In this condition, the signal "ckebx" is always set at the low level ("ckebx"="L"). During the active mode, the sense buffer circuit 50B outputs the data signal "rdbz" to the latch circuit 90B via the output node, the data signal "rdbz" being set at the high level ("H") or the low level ("L") in accordance with the amplified data signals at the nodes "n11" and "n13".

Suppose that when the signal "sbez" is set at the low level ("sbez"="L"), the sense buffer circuit 50B is set in the standby mode and the signal "ckebx" is set at the high level ("ckebx"="H"). As shown in FIG. 10, during the standby mode, the logic circuit 40, which receives both the signal "ckebx" and the signal "rdbz", sets both the node "n14" and the node "n15" at the low level ("L") when the signal "rdbz" is set at the high level ("rdbz"="H"), and sets both the node "n14" and the node "n15" at the high level ("H") when the signal "rdbz" is set at the low level ("rdbz"="L").

In the former case ("rdbz"="H"), the transistor 14 is set in ON state and the transistor 15 is set in OFF state. The high-threshold transistor 15 serves to avoid the sub-threshold leaking current across the n-channel MOS transistor 11. The high-threshold transistor 15 provides the reduction of the sub-threshold leaking current which is equivalent to that when the drain of the transistor 11 is connected to the countermeasure voltage line "Vssx" as in the previous embodiment of FIG. 5.

In the latter case ("rdbz"="L"), the transistor 14 is set in OFF state and the transistor 15 is set in ON state. The high-threshold transistor 14 serves to avoid the sub-threshold leaking current across the p-channel MOS transistor 13. The high-threshold transistor 14 provides the reduction of the sub-threshold leaking current which is equivalent to that when the source of the transistor 13 is connected to the countermeasure voltage line "Viiz".

Further, as shown in FIG. 10, in the latch circuit 90B during the standby mode, the countermeasures against the sub-threshold leaking current which are the same as described above are taken by the corresponding high-threshold transistors of the latch circuit 90B.

In the above-described embodiment, when the sense buffer circuit 50B is set in the standby mode and the data signal "rdbz" is set in either the high level or the low level, the corresponding one of the high-threshold transistors 14, 15, 54, 55, 64 and 65, which are set in OFF state by the logic circuits 40 and 42A, provide the reduction of the sub-threshold leaking current. The sense buffer circuit 50B of the present embodiment becomes effective, especially when it is desired that the previous state of the data signal "rdbz" output from the output node of the sense buffer circuit 50B be stored without making a forceful change thereto even after the sense buffer circuit 50B is set in the standby mode.

Figure 11:
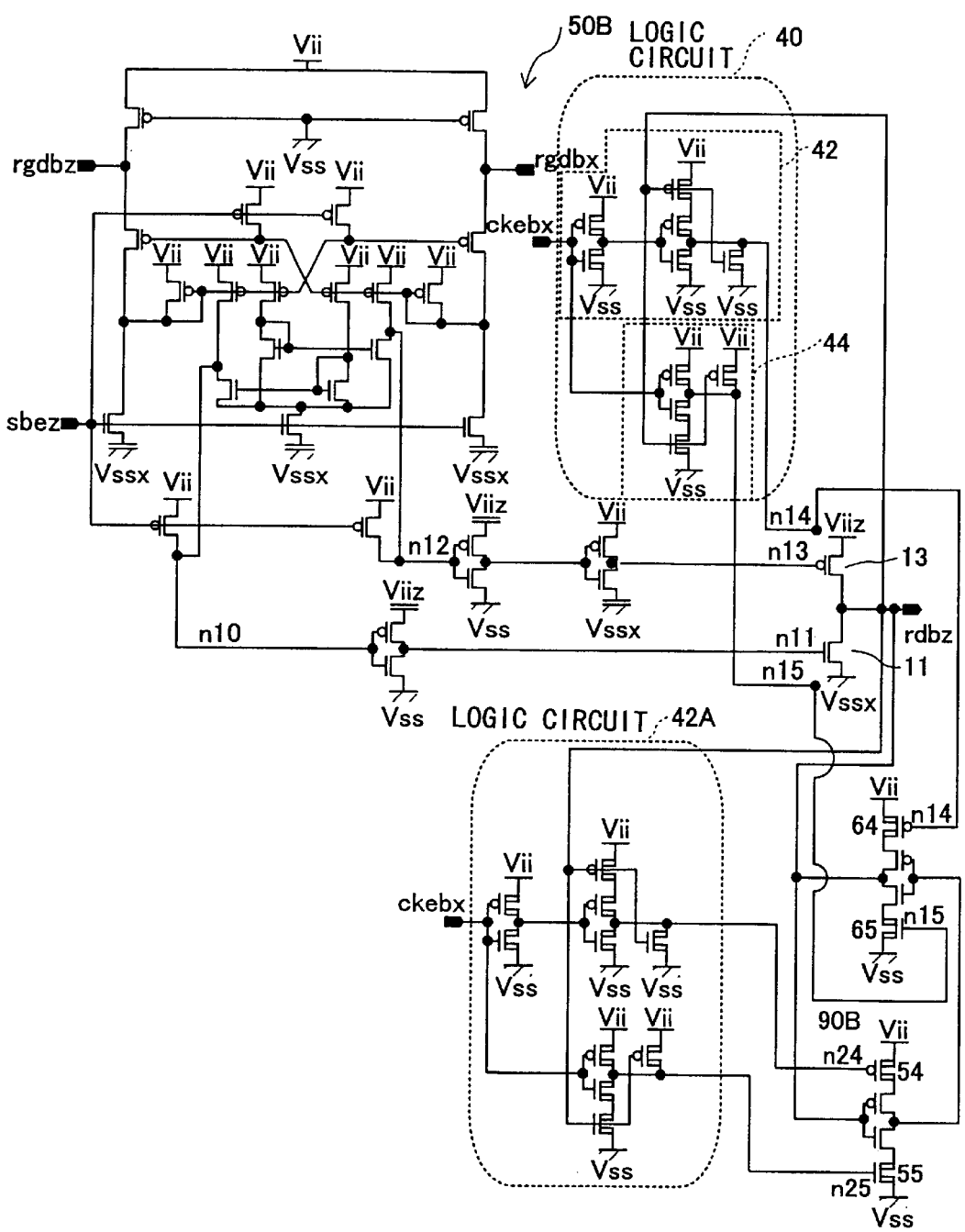
FIG. 11 is a circuit diagram of a variation of the sense buffer circuit in FIG. 9.

Next, FIG. 11 shows a variation of the sense buffer circuit 50B in FIG. 9.

As shown in FIG. 11, in the sense buffer circuit 50B of this embodiment, the high-threshold transistors 14 and 15 as in the previous embodiment of FIG. 9 are not provided. Instead, in the present embodiment, the source of the p-channel transistor 13 is connected to the countermeasure voltage line "Viiz", and the source of the n-channel transistor 11 is connected to the countermeasure voltage line "Vssx".

When the signal "rdbz" is set at the high level during the standby mode, a high level of the electric field is applied between the source and the drain of the transistor 11. As the source of the transistor 11 is connected to the countermeasure voltage line "Vssx", it is possible for the sense buffer circuit 50B of this embodiment to avoid the sub-threshold leaking current across the transistor 11 in such a condition. On the other hand, when the signal "rdbz" is set at the low level during the standby mode, a high level of the electric field is applied between the source and the drain of the transistor 13. As the source of the transistor 13 is connected to the countermeasure voltage line "Viiz", it is possible for the sense buffer circuit 50B of this embodiment to avoid the sub-threshold leaking current across the transistor 13 in such a condition.

When the sense buffer circuit 50B is set in the active mode, the conditions Vii=Viiz and Vss=Vssx are met in the present embodiment. Hence, the sense buffer circuit 50B during the active mode outputs the data signal "rdbz" to the latch circuit 90B via the output node, the data signal "rdbz" being set at the high level ("H") or the low level ("L") in accordance with the amplified data signals at the nodes "n11" and "n13". However, with respect to the latch circuit 90B of this embodiment, it is necessary to take the countermeasures against the sub-threshold leaking current that are the same as those of the previous embodiment of FIG. 9 (or, the high-threshold transistors 54, 55, 64 and 65).

As described above, according to the sense buffer circuit of the preferred embodiment of the invention, the logic circuit uniquely determines the level of the output node of the sense buffer circuit during the standby mode based on the level of the control signal even if the output node of the sense buffer circuit is connected to the latch circuit. By using the logic circuit, the sense buffer circuit of the preferred embodiment makes it possible to easily take the countermeasures against the sub-threshold leaking current. Therefore, the sense buffer circuit of the preferred embodiment can remarkably reduce the sub-threshold leaking current during the standby mode by the use of the countermeasure voltage line, thereby reducing the standby power consumption.

The present invention is not limited to the above-described embodiments, and variations and modifications may be made without departing from the scope of the present invention.

Further, the present invention is based on Japanese priority application No. 2001-215335, filed on Jul. 16, 2001, the entire contents of which are hereby incorporated by reference.

What is claimed is:

1. A semiconductor integrated circuit having an active mode and a standby mode, comprising:

a node at which an internal circuit is connected to a latch circuit, the latch circuit storing a data signal output from the internal circuit wherein the latch circuit has a transistor connected to a power source voltage line that is set in a floating state in the standby mode, the transistor being set in OFF state in the standby mode; and a level determination unit determining a logic level of the node in response to a control signal indicating the standby mode.

2. The semiconductor integrated circuit according to claim 1, wherein the internal circuit includes a CMOS driver including a p-channel transistor and an n-channel transistor and driving the node as to output the data signal in the active mode, wherein the level determination unit controls said CMOS driver such that one of the p-channel transistor and the n-channel transistor is set in ON state and the other is set in OFF state in the standby mode, wherein said CMOS driver is configured such that said OFF-state transistor in the standby mode is connected to a power-source voltage line having a floating state in the standby mode.

3. The semiconductor integrated circuit according to claim 1, wherein said level determination unit comprises a clamping transistor which is connected to said node, the clamping transistor being set in ON state based on said control signal in the standby mode.

4. The semiconductor integrated circuit according to claim 1, wherein the internal circuit includes a CMOS driver including a p-channel transistor and an n-channel transistor and driving the node so as to output the data signal in the active mode, wherein one of the p-channel transistor and the n-channel transistor of the CMOS driver, which is set in OFF state by the level determination unit in the standby mode, is connected to a power-source voltage line having a floating state in the standby mode.

5. The semiconductor integrated circuit according to claim 1, wherein said latch circuit comprises two concatenated CMOS inverters, and each of the inverters includes a p-channel transistor and an n-channel transistor, wherein one of the p-channel transistor and the n-channel transistor of each inverter, which is set in OFF state by the level determination unit in the standby mode, is connected to a power-source voltage line having a floating state in the standby mode.

6. A semiconductor integrated circuit having an active mode and a standby mode, comprising:

a node which is set at a logic level that is not uniquely determined in the standby mode;

a pair of first transistors each having an output connected to the node, the first transistors driving the node to output a signal;

a logic circuit receiving the signal from the node as an input signal and outputting a control signal based on the logic level of the node in the standby mode; and a pair of second transistors each connected in series to one of the first transistors and being set in one of ON state and OFF state based on the control signal output by the logic circuit in the standby mode.

7. The semiconductor integrated circuit according to claim 6, wherein said second transistors have a high-level threshold voltage that is higher than a threshold voltage of said first transistors.

8. The semiconductor integrated circuit according to claim 6, further comprising a latch circuit connected at the node, the latch circuit comprising two concatenated CMOS inverters, each of the inverters including a p-channel transistor and an n-channel transistor, wherein the latch circuit further includes a pair of third transistors connected in series to one of the p-channel transistor and the n-channel transistor of each inverter, the third transistors electrically isolating one of the p-channel transistor and the n-channel transistor of each inverter, which is set in OFF state by the control signal of the logic circuit in the standby mode, from one of a first power-source voltage line and a second power-source voltage line.

9. A semiconductor integrated circuit having an active mode and a standby mode, comprising:

a node which is set at a logic level that is not uniquely determined in the standby mode; and a CMOS driver including a p-channel transistor and an n-channel transistor each having an output connected to the node, the CMOS driver driving the node so as to output a data signal in the active mode, and the p-channel transistor and the n-channel transistor of the CMOS driver being set in OFF state in the standby mode, wherein the p-channel transistor and the n-channel transistor of the CMOS driver are connected to power-source voltage lines having a floating state in the standby mode.

10. The semiconductor integrated circuit according to claim 9, further comprising a latch circuit connected at the node, the latch circuit comprising two concatenated CMOS inverters, each of the inverters including a p-channel transistor and an n-channel transistor, wherein the latch circuit further includes a pair of transistors connected in series to one of the p-channel transistor and the n-channel transistor of each inverter, the transistors electrically isolating one of the p-channel transistor and the n-channel transistor of each inverter, which is set in OFF state by a control signal of a logic circuit in the standby mode, from a power-source voltage line having a floating state in the standby mode.

* * * * *